(12) United States Patent
Wieczorek et al.

(10) Patent No.: US 6,703,278 B2
(45) Date of Patent: Mar. 9, 2004

(54) METHOD OF FORMING LAYERS OF OXIDE ON A SURFACE OF A SUBSTRATE

(75) Inventors: Karsten Wieczorek, Dresden (DE); Falk Graetsch, Dresden (DE); Stephan Kruegel, Boxdorf (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/208,308

(22) Filed: Jul. 30, 2002

(65) Prior Publication Data

US 2003/0157772 A1 Aug. 21, 2003

(30) Foreign Application Priority Data

Feb. 20, 2002 (DE) .......................................... 102 07 122

(51) Int. Cl.$^7$ ............................................. H01L 21/336
(52) U.S. Cl. ....................... 438/287; 257/410; 257/411; 438/275; 438/585; 438/591; 438/745; 438/756; 438/757
(58) Field of Search ................. 257/410, 411; 438/275, 287, 585, 591, 745, 756, 757

(56) References Cited

U.S. PATENT DOCUMENTS

| | | | |
|---|---|---|---|
| 5,254,488 A | 10/1993 | Haller .......................... | 438/160 |
| 5,466,622 A | * 11/1995 | Cappelletti .................. | 438/258 |
| 5,502,009 A | 3/1996 | Lin ............................... | 438/275 |
| 5,576,226 A | 11/1996 | Hwang ......................... | 438/275 |
| 5,723,355 A | * 3/1998 | Chang et al. ................ | 438/275 |
| 5,882,993 A | 3/1999 | Gardner et al. ............. | 438/591 |
| 5,939,763 A | 8/1999 | Hao et al. .................... | 257/411 |
| 5,985,725 A | 11/1999 | Chou .......................... | 438/294 |
| 6,033,943 A | 3/2000 | Gardner ...................... | 438/199 |
| 6,087,236 A | 7/2000 | Chau et al. .................. | 438/301 |
| 6,200,834 B1 | * 3/2001 | Bronner et al. ............. | 438/142 |
| 6,235,590 B1 | 5/2001 | Daniel et al. ................ | 438/275 |
| 6,331,492 B2 | 12/2001 | Misium et al. ............. | 438/762 |
| 6,551,884 B2 | * 4/2003 | Masuoka ...................... | 438/275 |
| 2003/0087532 A1 | * 5/2003 | Wu et al. ..................... | 438/745 |
| 2003/0100155 A1 | * 5/2003 | Lim et al. .................... | 438/197 |

FOREIGN PATENT DOCUMENTS

| | | | | |
|---|---|---|---|---|
| DE | 198 39 079 A1 | 9/1999 | ......... | H01L/21/316 |
| KR | 2001004417 | 1/2001 | ....... | H01L/21/3205 |
| WO | WO 01/15221 A1 | 3/2001 | ....... | H01L/21/8234 |

OTHER PUBLICATIONS

D. Bouvet et al., "Influence of Nitrogen Profile on Electrical Characteristics of Furnace or Rapid Thermally Nitrided Silicon Dioxide Films," *J. Appl. Phys.*, 79(9): 7114–7122, 1996.

E.P. Gusev et al., "The Composition of Ultrathin Silicon Oxynitrides Thermally Grown in Nitric Oxide," *J. Appl. Phys.*, 82(2): 896–898, 1997.

Campbell, Mark A. and Tang P.A. , "Reliability Improvement of Semitool SAT—Post CMP Cleans," *IEEE*: 199–202, 1999.

\* cited by examiner

*Primary Examiner*—Van Thu Nguyen
*Assistant Examiner*—Christian D. Wilson
(74) *Attorney, Agent, or Firm*—William, Morgan & Amerson

(57) ABSTRACT

A method of forming oxide layers of different thickness on a substrate is described, wherein the oxide layers preferably serve as gate insulation layers of field effect transistors. The method allows to form very thin, high quality oxide layers with a reduced number of masking steps compared to the conventional processing, wherein the thickness difference can be maintained within a range of some tenths of a nanometer. The method substantially eliminates any high temperature oxidations and is also compatible with most chemical vapor deposition techniques used for gate dielectric deposition in sophisticated semiconductor devices.

96 Claims, 8 Drawing Sheets

US 6,703,278 B2

METHOD OF FORMING LAYERS OF OXIDE ON A SURFACE OF A SUBSTRATE

BACKGROUND OF THE INVENTION

1. Field of the Invention

The present invention relates to the field of fabrication of integrated circuits, and, more particularly, to a method of forming oxide layers on the surface of a substrate during the fabrication of semiconductor devices.

2. Description of the Related Art

During the fabrication process of integrated circuits, several oxide layers of different thickness are formed on the surface of a substrate (for instance a silicon substrate) at various manufacturing stages for a variety of different purposes. For instance, relatively thick oxide layers are required for most electrical insulation purposes. However, in metal oxide silicon (MOS) devices, the gate oxide, which insulates the gate from the source, drain and the channel, is required to be as thin as possible to allow the electrical potential applied to the gate to effectively influence charge carriers in the substrate, thus forming the channel.

The ever increasing miniaturization, during the last years, of the devices manufacturable on a substrate, has required the realization of MOS devices (including CMOS devices, PMOS devices, NMOS devices, and the like) featuring gate oxide layers in the range of only a few nanometers. This is essentially due to the fact that, as the dimensions of the MOS devices decrease, the channel length approaches the dimensions of the width of the depletion regions of the source and drain junctions. As a result, a certain portion of the channel region is partially depleted without any influence of the gate voltage. To compensate for this effect, a gate oxide of reduced thickness is required.

This being the situation, many efforts have been made in the past for realizing very thin gate oxide layers featuring a low defect rate, i.e., a minimal number of dopants and minimal crystalline defects in the gate oxide layer.

However, along with the exigence of realizing gate oxides of ever decreasing thickness, there has been an increased demand to integrate circuits or devices on a single chip that are operated at different supply voltages. In fact, in order to obtain a very high level of integration, devices performing different functions must be integrated on the same chip. Accordingly, since for a given supply voltage at which a MOS device is operated, the drain current is inversely proportional to the thickness of the gate oxide, MOS devices featuring different gate oxide thicknesses may be formed to meet the very different requirements for a complex circuit. Moreover, the most modem integrated devices performing very complex operations require the realization of CMOS devices featuring a so-called dual gate oxide, namely CMOS devices wherein the gate oxides on the P-channel and the N-channel have a different thickness.

Typically, the thickness differences on such dual gate oxide devices must be generally maintained within the range of a few tenths of a nanometer. As a result, the formation of dual gate oxides has become a major challenge in the manufacturing of integrated devices. Accordingly, it would be highly desirable to provide a method of reliably forming dual gate oxides featuring extremely low thickness differences.

In the following, description will be given with reference to FIGS. 1a–1d and 2a–2e of two commonly used prior art methods of forming dual gate oxides. In FIGS. 1a–1d, reference 1 relates to a substrate, for instance a silicon wafer, on which two oxide layers of different thickness must be conned on portions 2 and 3 of the upper surface, respectively. According to the prior art method depicted in FIGS. 1a–1d, the portion of the surface of the substrate targeted for the thin thick layer of oxide (in the present case portion 2) is first masked with a layer of resist 6, and ions are implanted at high dose and energy on the portion of the surface of the substrate targeted for the thick layer of oxide (in the present case portion 3), so as to create severe damage in that portion (see FIG. 1b).

Subsequently, in a next step as depicted in FIG. 1c, the resist layer 6 is removed. Finally, the substrate 1 is subjected to a conventional gate oxidation processing. Due to the damage produced by the ions implanted in the portion 3, the diffusion of oxygen in the portion 3 is enhanced and, as a result, as depicted in FIG. 1d, a thick layer of oxide will grow on portion 3 of the surface of the substrate 1.

The prior art method described above has the advantage that a single masking step is sufficient. However, this method requires a high temperature oxidation process and is, therefore, not compliant with alternative approaches for ultra-thin gate-dielectric processing. In fact, it has to be noted that high temperature oxidation processes modify the density profile of ions implanted in the substrate and therefore influence the electrical behavior of the final device. Finally, the prior art method described above in FIGS. 1a–1d has the drawback that the thick oxide layer is prone to premature failures which result in a decreased reliability of the final device.

A further prior art method of forming a dual gate oxide will be described in the following with reference to FIGS. 2a–2e. As in the case of the prior art method disclosed previously, in FIGS. 2a–2e there is depicted a substrate 1 with portions 2 and 3 on its upper surface. In a first step, a thick layer of oxide 5 is formed on both portions 2 and 3, as depicted in FIG. 2b; to this end, a common process, for instance a thermal oxidization process, may be carried out.

Subsequently, as depicted in FIG. 2c, the portion 2 of the surface of the substrate targeted for the thicker oxide layer is masked, for instance using a masking resist 6. In a further step, as depicted in FIG. 2d, the oxide layer 5 is removed from the portion 3 of the surface of the substrate 1 targeted for the thin oxide layer. To this end, the substrate 1 is subjected to either a wet-etching or a dry-etching process. The resist layer 6 is then removed and a second gate oxide is grown by conventional thermal processing on both surface portions 2 and 3. As a result, a final oxide layer 3' on portion 3 is obtained, together with a final oxide layer 5' on portion 2. The thickness of the final layer 5' does not significantly differ from the thickness of the initial layer 5, and the final layers 3' and 5' feature the predefined, desired thickness difference.

The prior art method as described above has the disadvantage that the two oxide layers 5' and 3' have thicknesses differing more than 30 angstroms. This large thickness difference makes it difficult for the final device to exhibit the desired electrical performance characteristics.

In view of the above-explained problems, it would be desirable to have an improved method of forming dual gate oxides eliminating or at least partially limiting one or more of the drawbacks of the prior art.

SUMMARY OF THE INVENTION

Generally, the present invention is directed to various methods of forming oxide layers of different thicknesses, wherein the number of masking steps may be reduced and/or high temperature processes are substantially eliminated. For this purpose, according to a first embodiment, the present invention relates to a method of forming at least one first layer of nitrided oxide of a first, predefined thickness on at least one first portion of the surface of a substrate and at least one second layer of nitrided oxide of a second, predefined, different thickness on at least one second portion of the surface of the substrate. The method comprises forming at least one initial layer of nitrided oxide of an initial thickness exceeding both the first and second predefined thicknesses on at least one first and one second portion of the surface of the substrate. Moreover, the method includes thinning the initial layer of nitrided oxide on at least one first portion of the surface of the substrate to the respective, first predefined thickness. Additionally, the method comprises thinning the initial layer of nitrided oxide on at least one second portion of the surface of the substrate to the respective, second, predefined, different thickness.

According to another embodiment, the invention relates to a method of forming at least one first layer of nitrided oxide of a first, predefined thickness on at least one first portion of the surface of a substrate and at least one second layer of nitrided oxide of a second, predefined, different thickness on at least one second portion of the surface of the substrate. In particular, the method comprises thermally growing at least one initial layer of oxide of an initial thickness exceeding both the first and second, predefined thicknesses on at least one first and one second portion of the surface of the substrate. Moreover, the initial layer of oxide is annealed in a nitrogen-containing atmosphere so as to form an initial layer of nitrided oxide on at least one first and one second portion of the surface of the substrate. Moreover, the method includes thinning the initial layer of nitrided oxide on at least one first portion of the surface of the substrate to the respective, first predefined thickness, and thinning the initial layer of nitrided oxide on at least one second portion of the surface of the substrate to the respective, second, predefined, different thickness.

According to a further embodiment, the invention relates to a method of forming at least one first layer of nitrided oxide of a first, predefined thickness on at least one first portion of the surface of a substrate and at least one second layer of nitrided oxide of a second, predefined, different thickness on at least one second portion of the surface of the substrate. The method comprises thermally growing at least one layer of oxide in a nitrogen-containing atmosphere so as to form at least one initial layer of nitrided oxide of an initial thickness exceeding both the first and second predefined thickness on at least one first and one second portion of the surface of the substrate. Moreover, the method includes thinning the initial layer of nitrided oxide on at least one first portion of the surface of the substrate to the respective, first predefined thickness, and thinning the initial layer of nitrided oxide on at least one second portion of the surface of the substrate to the respective, second, predefined, different thickness.

According to still another illustrative embodiment, the invention relates to a method of forming at least one first layer of oxide of a first, predefined thickness on at least one first portion of the surface of a substrate and at least one second layer of oxide of a second, predefined, different thickness on at least one second portion of the surface of the substrate, wherein the method comprises forming at least one initial layer of nitrided oxide of an initial thickness exceeding both the first and second predefined thickness on at least one first and one second portion of the surface of the substrate and thinning the initial layer of nitrided oxide on at least one first portion of the surface of the substrate to a first, intermediate thickness lower than the respective, first predefined thickness. Furthermore, the method includes thinning the initial layer of nitrided oxide on at least one second portion of the surface of the substrate to a second, intermediate thickness different from the first intermediate thickness and lower than the respective, second predefined thickness. Moreover a layer of oxide is added to at least two layers of nitrided oxide so as to obtain at least two layers of oxide of predefined, different thicknesses.

According to a further embodiment, the invention relates to a method of forming at least one first layer of oxide of a first, predefined thickness on at least one first portion of the surface of a substrate and at least one second layer of oxide of a second, predefined, different thickness on at least one second portion of the surface of the substrate, wherein the method comprises thermally growing at least one initial layer of oxide of an initial thickness exceeding both the first and second, predefined thicknesses on at least one first and one second portion of the surface of the substrate and annealing the initial layer of oxide in a nitrogen-containing atmosphere so as to form an initial layer of nitrided oxide on at least one first and one second portion of the surface of the substrate. Additionally, the method includes thinning the initial layer of nitrided oxide on at least one first portion of the surface of the substrate to a first, intermediate thickness lower than the respective, first predefined thickness and thinning the initial layer of nitrided oxide on at least one second portion of the surface of the substrate to a second, intermediate thickness different from the first intermediate thickness and lower than the respective, second predefined thickness.

According to a further illustrative embodiment, there is provided a method of forming at least one first layer of oxide of a first, predefined thickness on at least one first portion of the surface of a substrate and at least one second layer of oxide of a second, predefined, different thickness on at least one second portion of the surface of the substrate, wherein the method comprises thermally growing at least one layer of oxide in a nitrogen-containing atmosphere so as to form at least one initial layer of nitrided oxide of an initial thickness exceeding both the first and second predefined thicknesses on at least one first and one second portion of the surface of the substrate and thinning the initial layer of nitrided oxide on at least one first portion of the surface of the substrate to a first, intermediate thickness lower than the respective, first predefined thickness. Moreover, the method includes thinning the initial layer of nitrided oxide on at least one second portion of the surface of the substrate to a second, intermediate thickness different from the first intermediate thickness and lower than the respective, second predefined thickness and thermally growing a layer of oxide on at least two layers of nitrided oxide so as to obtain at least two layers of oxide of predefined, different thicknesses.

In another embodiment of the present invention there is provided a method of forming at least one first layer of oxide of a first, predefined thickness on at least one first portion of the surface of a substrate and at least one second layer of oxide of a second, predefined, different thickness on at least one second portion of the surface of the substrate, wherein the method comprises thermal growing at least one initial layer of oxide of an initial thickness exceeding both the first and second, predefined thickness on at least one first and one second portion of the surface of the substrate and annealing the initial layer of oxide in a nitrogen-containing atmosphere so as to form an initial layer of nitrided oxide on at least one first and one second portion of the surface of the substrate. Moreover, the method includes thinning the initial layer of nitrided oxide on at least one first portion of the surface of the substrate to a first, intermediate thickness lower than the respective, first predefined thickness and thinning the initial layer of nitrided oxide on at least one second portion of the surface of the substrate to a second, intermediate thickness different from the first intermediate thickness and lower than the respective, second predefined thickness. Finally, a layer of oxide is deposited on at least two layers of nitrided oxide by a chemical vapor deposition so as to obtain at least two layers of oxide of predefined, different thicknesses.

According to still another embodiment, the present invention relates to a method of forming at least one first layer of oxide of a first, predefined thickness on at least one first portion of the surface of a substrate and at least one second layer of oxide of a second, predefined, different thickness on at least one second portion of the surface of the substrate, wherein the method comprises thermally growing at least one layer of oxide in a nitrogen-containing atmosphere so as to form at least one initial layer of nitrided oxide of an initial thickness exceeding both the first and second predefined thickness on at least one first and one second portion of the surface of the substrate and thinning the initial layer of nitrided oxide on at least one first portion of the surface of the substrate to a first, intermediate thickness lower than the respective, first predefined thickness. Furthermore, the method includes thinning the initial layer of nitrided oxide on at least one second portion of the surface of the substrate to a second, intermediate thickness different from the first intermediate thickness and lower than the respective, second predefined thickness. Additionally, a layer of oxide is deposited on at least two layers of nitrided oxide with a chemical vapor deposition process so as to obtain at least two layers of oxide of predefined, different thicknesses.

According to a further embodiment, the present invention relates to a method of forming at least one first layer of oxide of a first, predefined thickness on at least one first portion of the surface of a substrate and at least one second layer of oxide of a second, predefined, different thickness on at least one second portion of the surface of the substrate, wherein the method comprises thermally growing at least one initial layer of oxide of an initial thickness exceeding both the first and second, predefined thicknesses oil at least one first and one second portion of the surface of the substrate and annealing the initial layer of oxide in a nitrogen-containing atmosphere so as to form an initial layer of nitrided oxide on at least one first and one second portion of the surface of the substrate. Moreover, the layer of nitrided oxide is removed from at least one first portion of the surface of the substrate targeted for the thin layer of oxide and the initial layer of nitrided oxide is thinned on at least one second portion of the surface of the substrate targeted for the thick layer of oxide to a thickness lower than the respective, predefined thickness. Additionally, the method includes thermal growing a layer of oxide on at least one first and one second portion of the surface of the substrate so as to obtain at least two layers of oxide of predefined, different thicknesses.

In still another embodiment of the present invention, there is provided a method of forming at least one first layer of oxide of a first, predefined thickness on at least one first portion of the surface of a substrate and at least one second layer of oxide of a second, predefined, different thickness on at least one second portion of the surface of the substrate, wherein the method comprises thermal growing at least one layer of oxide in a nitrogen-containing atmosphere so as to form at least one initial layer of nitrided oxide of an initial thickness exceeding both the first and second predefined thicknesses on at least one first and one second portion of the surface of the substrate. Furthermore, the layer of nitrided oxide is removed from at least one first portion of the surface of the substrate targeted for the thin layer of oxide and the initial layer of nitrided oxide is thinned on at least one second portion of the surface of the substrate targeted for the thick layer of oxide to a thickness lower than the respective, predefined thickness. Additionally, a layer of oxide is thermally grown on at least one first and one second portion of the surface of the substrate so as to obtain at least two layers of oxide of predefined, different thicknesses.

According to another aspect, the present invention relates to a method of forming at least one first layer of oxide of a first, predefined thickness on at least one first portion of the surface of a substrate and at least one second layer of oxide of a second, predefined, different thickness on at least one second portion of the surface of the substrate, wherein the method comprises thermal growing at least one initial layer of oxide of an initial thickness exceeding both the first and second, predefined thickness on at least one first and one second portion of the surface of the substrate and annealing the initial layer of oxide in a nitrogen-containing atmosphere so as to form an initial layer of nitrided oxide on at least one first and one second portion of the surface of the substrate. Moreover, the layer of nitrided oxide is removed from at least one first portion of the surface of the substrate targeted for the thin layer of oxide and the initial layer of nitrided oxide is thinned on at least one second portion of the surface of the substrate targeted for the thick layer of oxide to a thickness lower than the respective, predefined thickness. Additionally, a layer of oxide is deposited on at least one first and second portion of the surface of the substrate so as to obtain at least two layers of oxide of predefined, different thicknesses.

In a still further embodiment, the present invention relates to a method of forming at least one first layer of oxide of a first, predefined thickness on at least one first portion of the surface of a substrate and at least one second layer of oxide of a second, predefined, different thickness on at least one second portion of the surface of the substrate, wherein the method comprises thermally growing at least one layer of oxide in a nitrogen-containing atmosphere so as to form at least one initial layer of nitrided oxide of an initial thickness exceeding both the first and second predefined thickness on at least one first and one second portion of the surface of the substrate. Furthermore, the layer of nitrided oxide is removed from at least one first portion of the surface of the substrate targeted for the thin layer of oxide and the initial layer of nitrided oxide is thinned on at least one second portion of the surface of the substrate targeted for the thick layer of oxide to a thickness lower than the respective, predefined thickness. Additionally, a layer of oxide is deposited on at least one first and second portion of the surface of the substrate so as to obtain at least two layers of oxide of predefined, different thicknesses.

BRIEF DESCRIPTION OF THE DRAWINGS

The invention may be understood by reference to the following description taken in conjunction with the accompanying drawings, in which like reference numerals identify like elements, and in which.

Figure 1A:
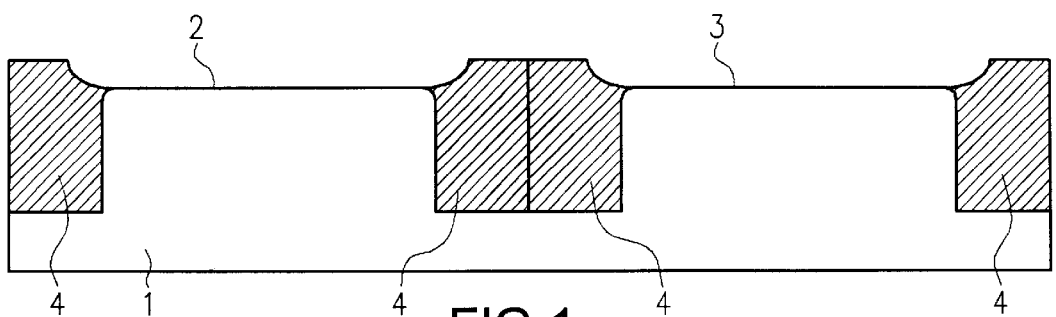
FIGS. 1a–1d represent a typical process sequence of a first prior art method of forming dual gate oxides.
Figure 1B:
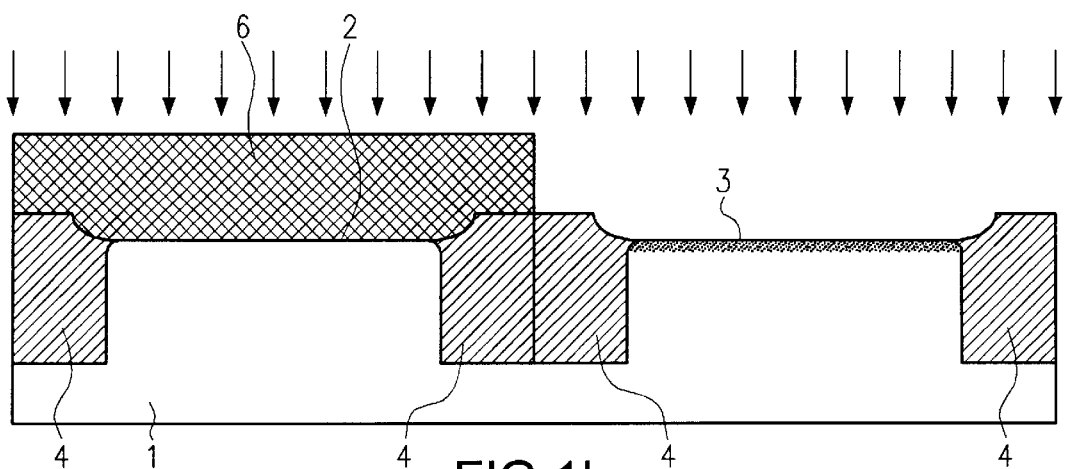
Figure 1C:
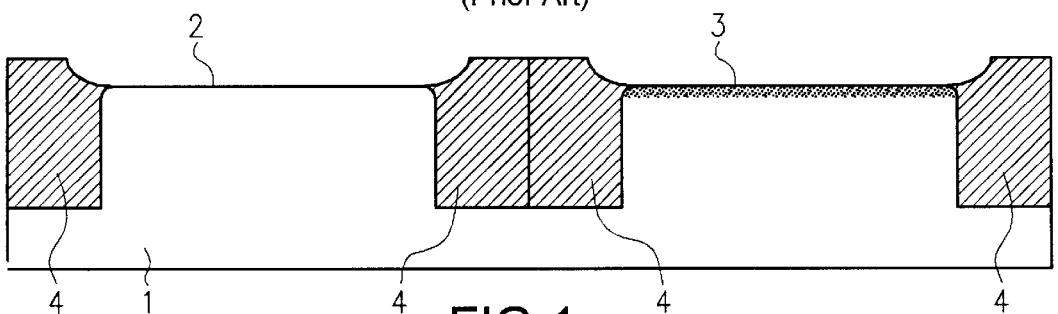
Figure 1D:
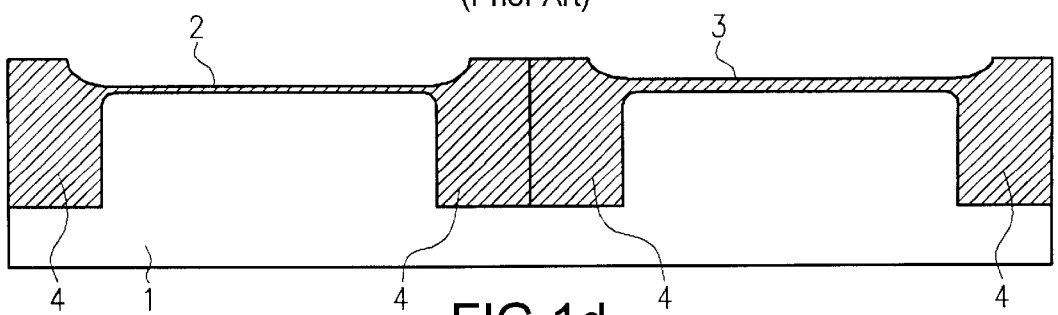
Figure 2A:
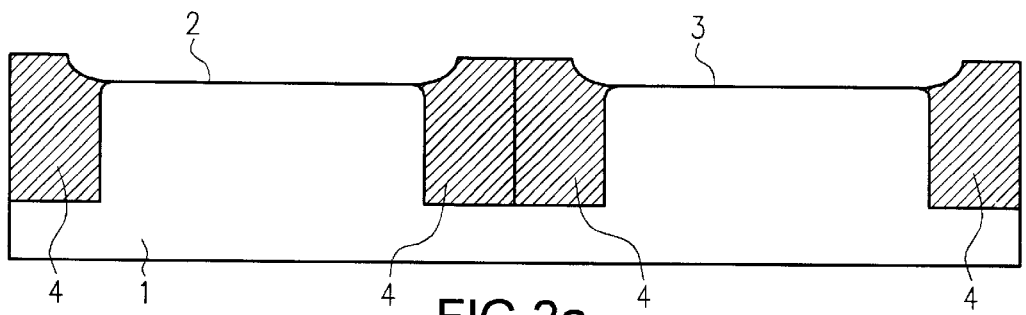
FIGS. 2a–2e represent another process sequence of a second prior art method of forming dual gates oxides.
Figure 2B:
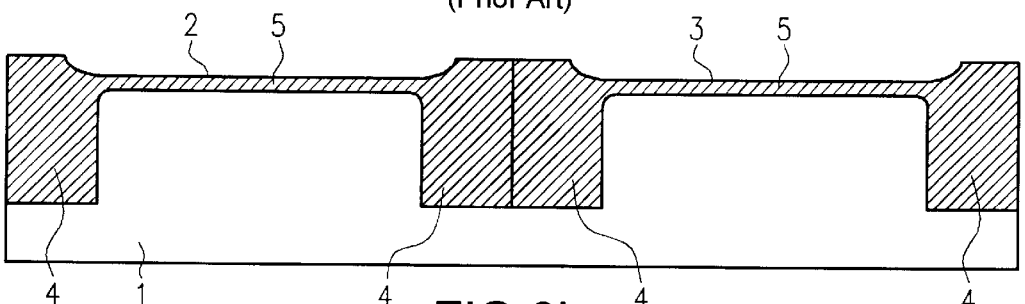
Figure 2C:
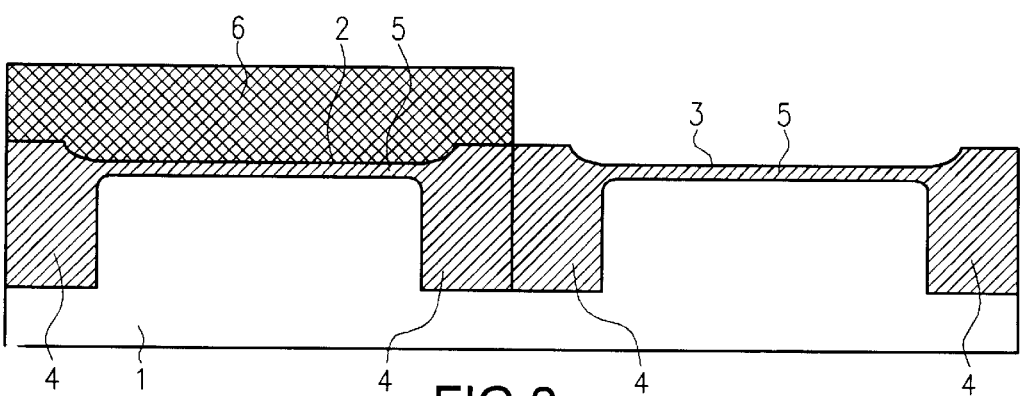
Figure 2D:
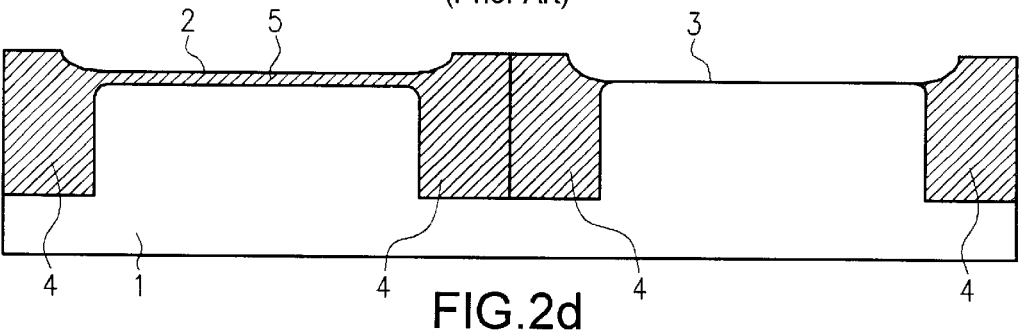
Figure 2E:
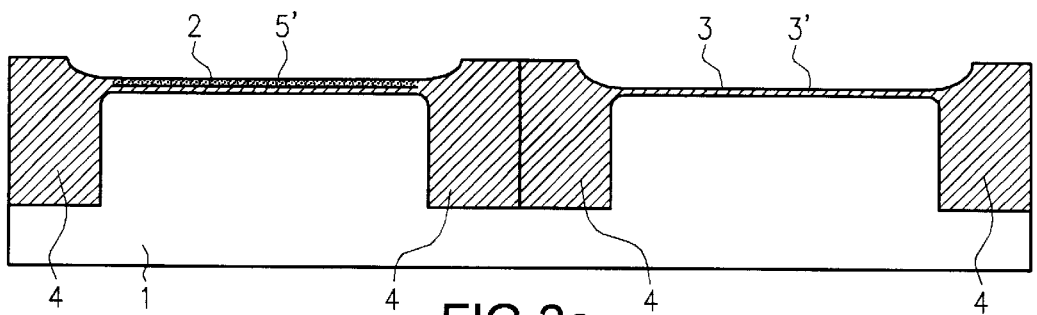

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The methods of forming oxide layers on a substrate disclosed herein have revealed to be of particular advantage when used for forming dual gate oxides of CMOS transistors. For this reason, examples will be given in the following in which corresponding embodiments of the method of the present invention are exploited for forming the dual gate oxide of a CMOS transistor. However, it has to be noted that the present invention is not limited to the formation of dual gate oxides of CMOS transistors, but can be used in any other situation in which the formation of oxide layers of different thicknesses on a substrate is required. It also has to be understood that, according to the present invention, not only a single dual oxide layer for a single CMOS transistor can be formed, but several dual gate oxides for corresponding CMOS transistors can be formed.

In FIGS. 3a–3g, 4a–4g and 5a–5f, reference 1 relates to an arbitrary section of a substrate, for instance a silicon wafer, on which a CMOS transistor will be formed. The upper surface of this arbitrary section is divided into portions 2 and 3 by isolation structures 4 which have been previously formed according to processes well known to those skilled in the art. In the specific case depicted in FIGS. 3–5, it is assumed that shallow trench isolation (STI) structures have been formed. However, other isolation structures, for instance LOCOS (local oxidation of silicon) structures could have been formed instead of STI structures. Regardless of the method used, the isolation structures 4 essentially comprise an insulating material such as silicon oxide.

Moreover, in the figures, references 6 and 8 relate to corresponding layers of masking resist while reference 5 relates to an initial layer formed on both portions 2 and 3. In FIGS. 3d–3f, 4d–4g and 5f, references 7 and 9 relate to the final layers formed on the portions 3 and 2 of the substrate, respectively. In FIGS. 4d–4f and 5e, references 7' and 9' relate to intermediate layers formed on the portions 3 and 2, respectively.

Figure 3A:
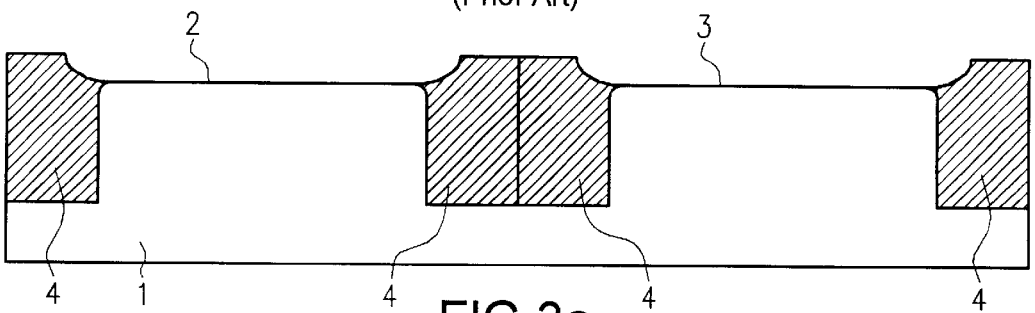
FIGS. 3a–3g represent a process sequence of a method of forming oxide layers on the surface of a substrate according to one embodiment of the present invention.
Figure 3B:
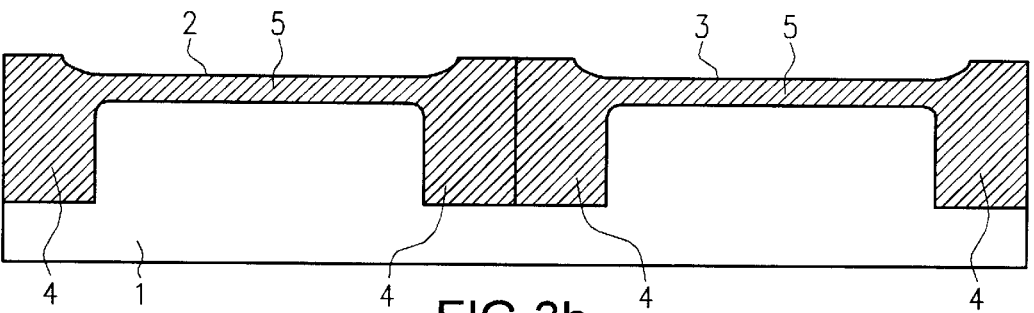
Figure 3C:
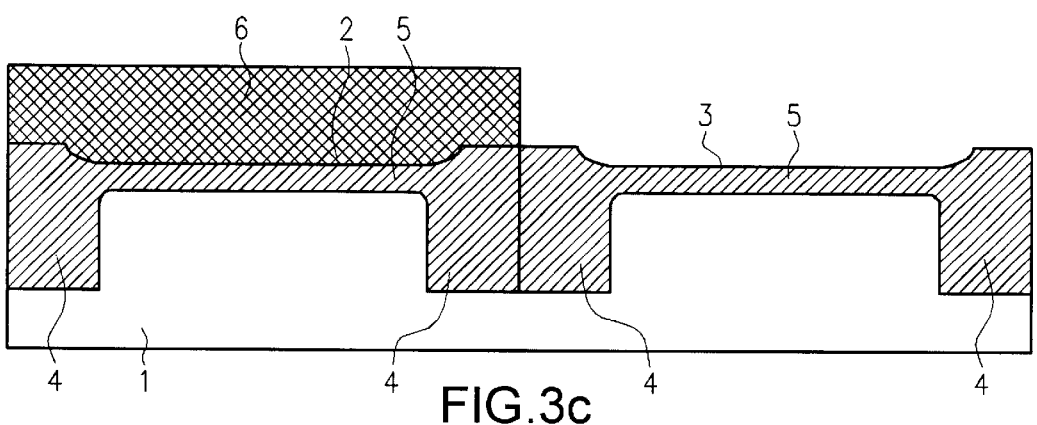

In the following, illustrative embodiments of process flows for forming the devices depicted in the figures are described. In FIGS. 3a–3g, according to one embodiment of the present invention, the initial layer 5 of, for example, nitrided oxide, is formed on both surface portions 2 and 3 (FIG. 3b). The initial layer 5 can be formed by first thermally growing an initial layer of oxide and annealing the initial layer of oxide in a nitrogen-containing atmosphere for— instance comprising ammonia ($NH_3$) or nitrous oxide ($N_2O$) or nitric oxide (NO) or a mixture thereof. Alternatively, the initial layer 5 may directly be thermally grown in a nitrous atmosphere—for instance comprising nitrous oxide ($N_2O$) or nitric oxide (NO) or a mixture thereof.

The initial layer 5 of nitrided oxide is formed to a thickness exceeding the final, predefined thickness of both oxide layers that will be formed on the portions 2 and 3, respectively. For instance, the nitrided oxide layer 5 can be formed to a thickness that exceeds the desired, predefined thickness of the final layers by about 10–50%.

After the initial layer 5 has been formed, the portion of the surface of the substrate targeted for the final, thick layer (in the present case portion 2, but portion 3 could have been selected as well) is masked, for instance by depositing a masking layer 6 of, for example, photoresist. Masking the portion 2 can be carried out according to methods well known in the art, including suitable photolithographic steps.

With the portion 2 of the substrate being covered by the masking layer 6, the uncovered initial layer 5 on the portion 3 is thinned to a thickness corresponding to the final thickness of the layer 7. Thinning the layer 5 on portion 3 can be carried out by, for example, wet-etching the layer 5. To this end, in one embodiment, the substrate may be immersed in an ammonium peroxide mixture for a predefined period of time, with the ammonium peroxide mixture having a predefined etching rate. In this respect, it has to be noted that, by wet-etching the nitrided oxide layer, the thickness of the final layer may essentially correspond to the predefined thickness. In fact, since the etching rate of the etching mixture can be established in advance, and since the nitrided oxide is wet-etched at an essentially constant rate, the final thickness of the layer 7 can be reliably and reproducibly predefined by selecting the etching time of the etching step.

Figure 3D:
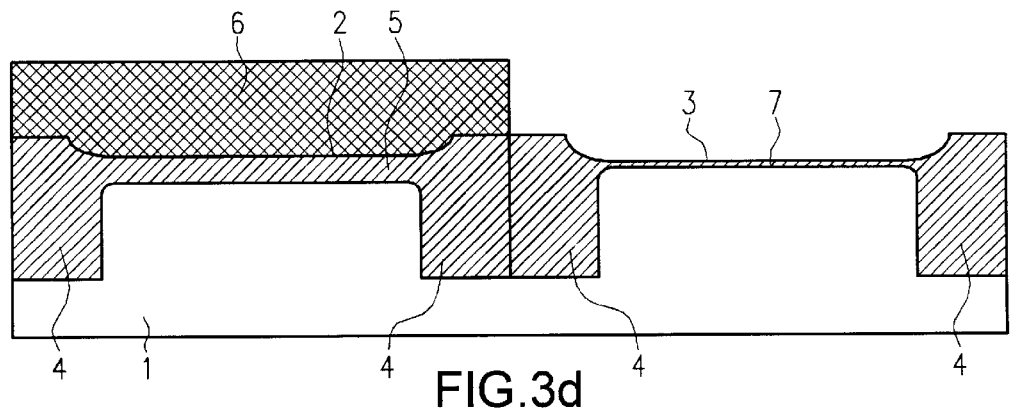
Figure 3E:
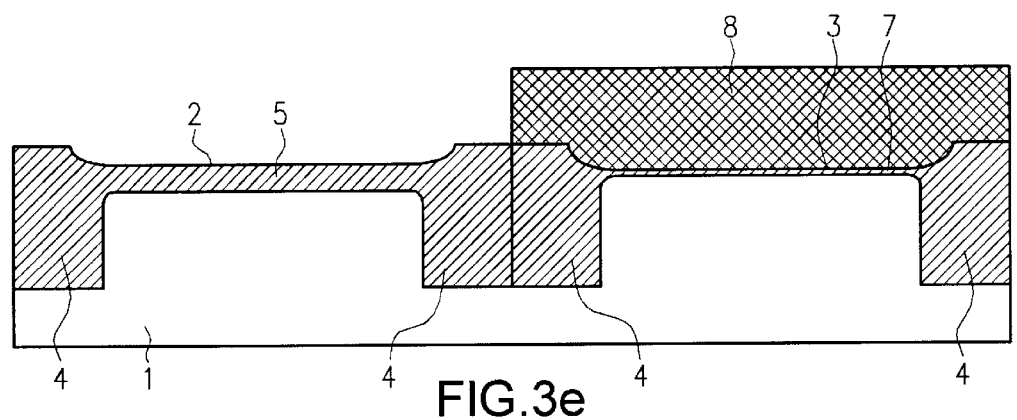
Figure 3F:
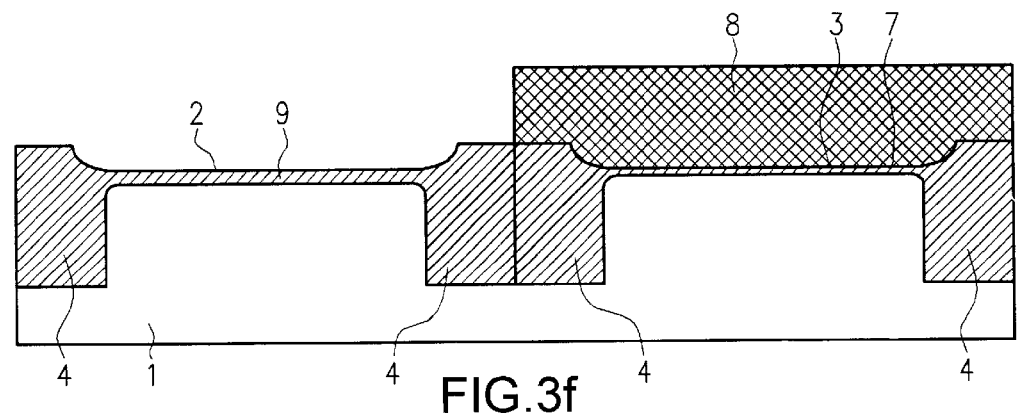
Figure 3G:
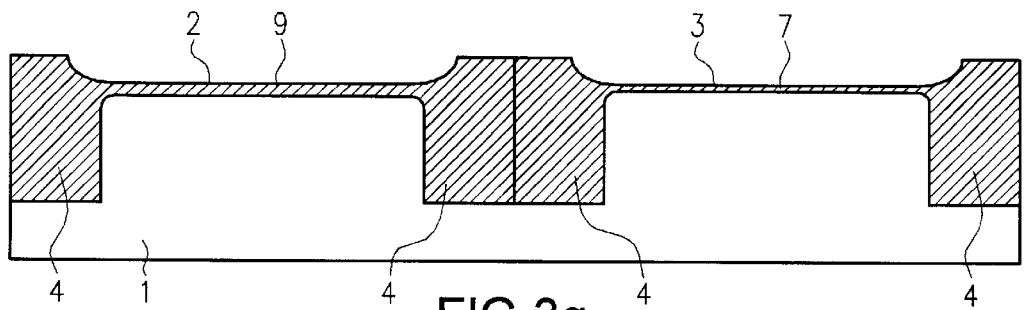

Referring to FIG. 3d, the initial layer 5 on portion 3 of the surface has been thinned to the desired, predefined thickness and a final layer 7 of nitrided oxide on portion 3 is obtained. Thereafter, the masking layer 6 on portion 2 is removed and portion 3 is masked with masking layer 8. The masking layer 8 may be comprised of, for example, photoresist, as in the case of the masking layer 6 on the portion 2 (see FIG. 3c). The initial, uncovered nitrided oxide layer 5 on portion 2 of the surface is then thinned to a second predefined thickness, differing from the thickness of layer 7 formed on portion 3. Again, thinning the layer 5 on portion 2 may comprise wet-etching the layer 5 as previously described with respect to the layer 5 on portion 3. By selecting an etching mixture of a predefined etching rate and by immersing the substrate in this mixture during a predefined period of time, the second final layer 9 on portion 2 may be obtained with the thickness of the final layer 9 differing from the thickness of the final layer 7.

The embodiments described so far allow obtaining oxide layers of different thickness on corresponding portions of a substrate in a more efficient way compared to the prior art processing. In fact, for instance, by simply selecting differing periods of time for the etching steps, layers of different thicknesses can be obtained. Moreover, since etching nitrided oxide has revealed to be a very reliable procedure, nitrided oxide layers differing in thickness only a few tenths of a nanometer (nm) can be obtained. Finally, it should also be noted that different thicknesses can also be obtained by using etching mixtures having a different etching rate for the two etching steps.

In the following, description will be given with reference to FIGS. 4a–4g of a further illustrative embodiment, wherein FIGS. 4b–4f relate to process steps, in which the same reference numbers are used as in the process steps described with reference to FIGS. 3b–3g. Accordingly, a detailed description of these steps is omitted.

Figure 4A:
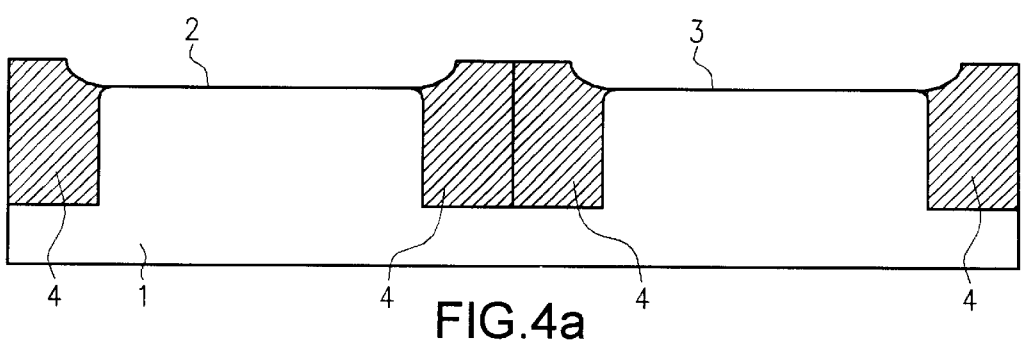
FIGS. 4a–4g represent another process sequence of a method of forming oxide layers on the surface of a substrate according to another embodiment of the present invention.
Figure 4B:
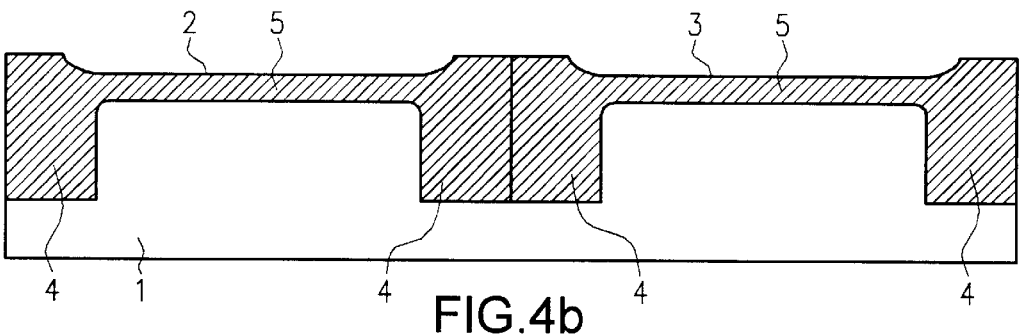

In a first step, the initial layer 5 of nitrided oxide is formed on both portions 2 and 3 of the surface of the substrate (see FIG. 4b). The layer 5 may be formed by thermally growing a first layer of oxide and annealing the layer of oxide in a nitrogen-containing atmosphere or by directly thermally growing a layer of oxide in a nitrogen-containing atmosphere as in the case of the embodiments previously described.

Figure 4C:
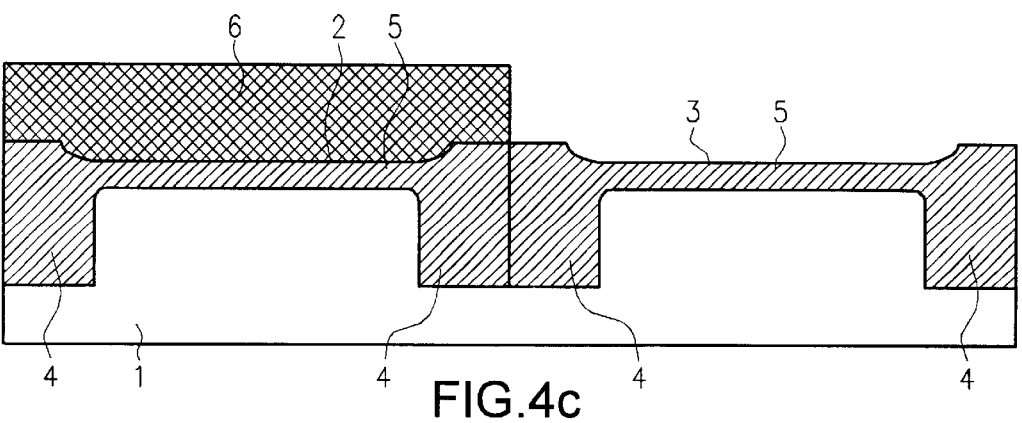
Figure 4D:
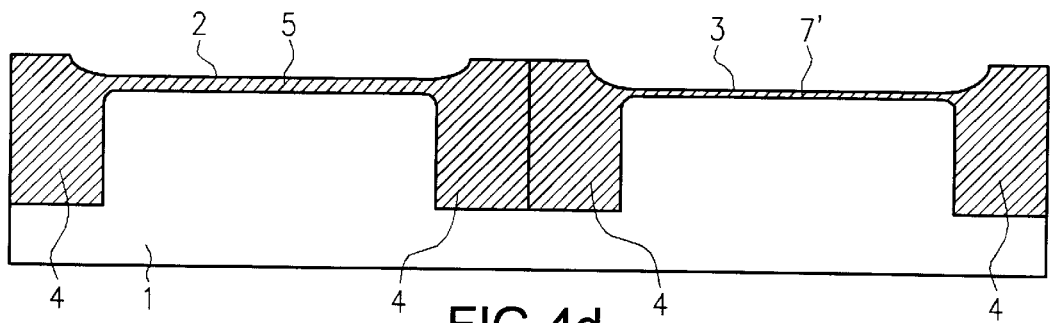

In a following step, as depicted in FIG. 4c, the masking layer 6 of, for example, photoresist, is deposited on the portion 2, and the uncovered initial layer 5 on the portion 3 is thinned, for instance by wet-etching. This results in the formation of the intermediate layer 7' of nitrided oxide of a first predefined intermediate thickness lower than the predefined final thickness (see FIG. 4d) on portion 3.

Figure 4E:
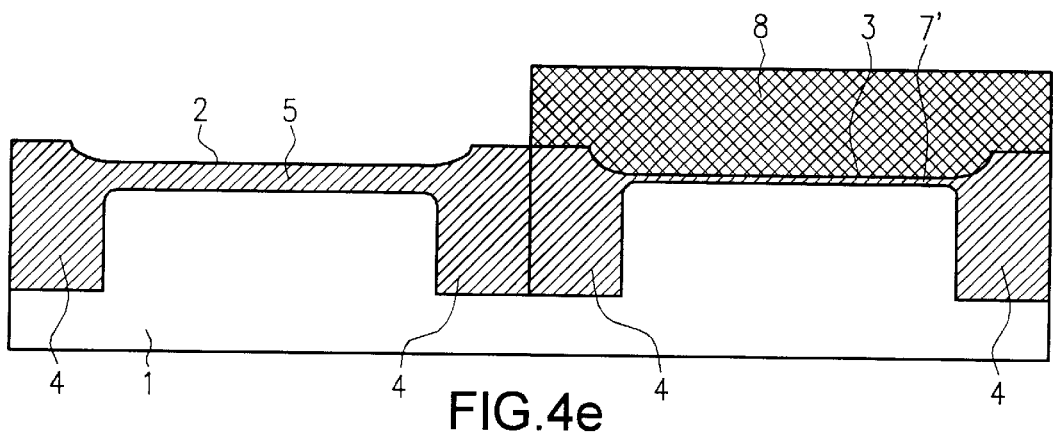
Figure 4F:
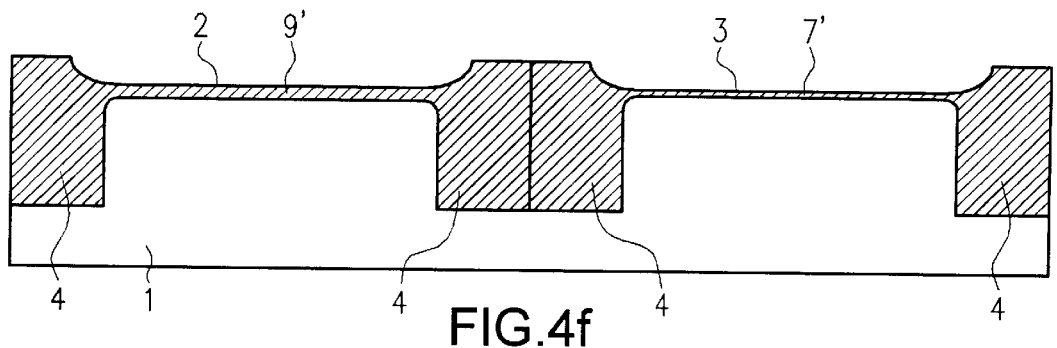

As depicted in FIG. 4e, the masking layer 6 on portion 2 is then removed and a masking layer 8 of, for example, photoresist, is deposited on the portion 3. The uncovered initial layer 5 on portion 2 is then thinned (for instance by wet-etching) so as to obtain the second intermediate layer 9' of nitride oxide of an intermediate thickness lower than the final predefined thickness and differing from the thickness of the intermediate layer 7' (see FIG. 4f).

Figure 4G:
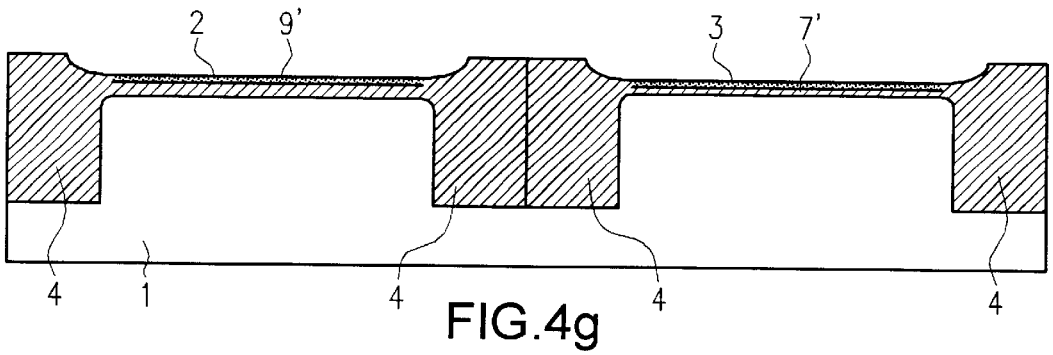

In a final step, as depicted in FIG. 4g, a layer of oxide is added to both the intermediate nitrided oxide layers 7' and 9' so as to obtain the two final layers 7 and 9 on portions 2 and 3 of the surface, with the thickness of the layers 7 and 9 corresponding to the final predefined thicknesses and differing from each other.

For the purposes of adding a layer of oxide to the intermediate layers of nitrided oxide on portions 2 and 3, several procedures may be selected. In one embodiment, for instance, a layer of oxide can be thermally grown on the intermediate layers 7' and 9'. Alternatively, a layer of oxide can be deposited on the intermediate layers 7' and 9', for instance during a chemical vapor deposition process.

As in the case of the embodiments described with reference to FIGS. 3a–3g, only two masking steps are required. Moreover, oxide layers differing in thickness only a few tenths of a nanometer (nm) may be obtained. The embodiments described above with reference to FIGS. 4a–4g may preferably be used in applications where oxide layers are desired instead of nitrided oxide layers.

Figure 5A:
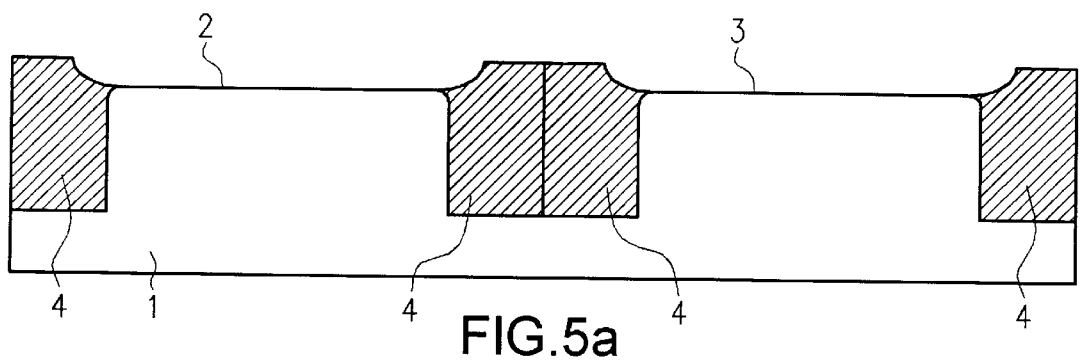
FIGS. 5a–5f represent a process sequence of a method of forming oxide layers on the surface of a substrate according to a further embodiment of the present invention.
Figure 5B:
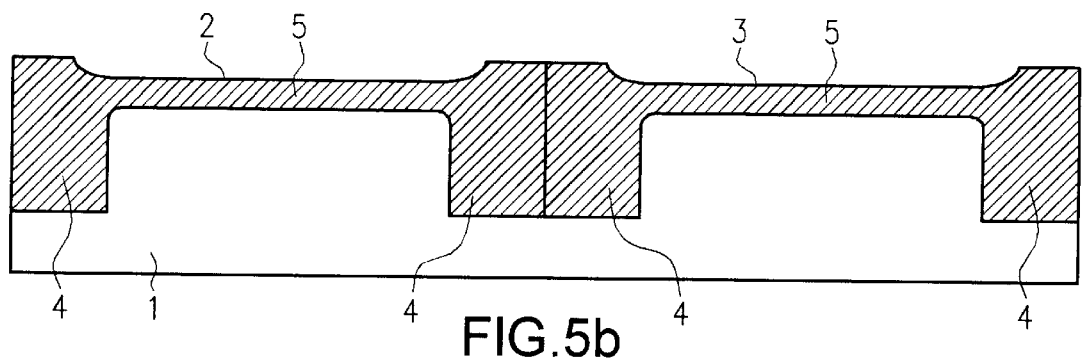
Figure 5C:
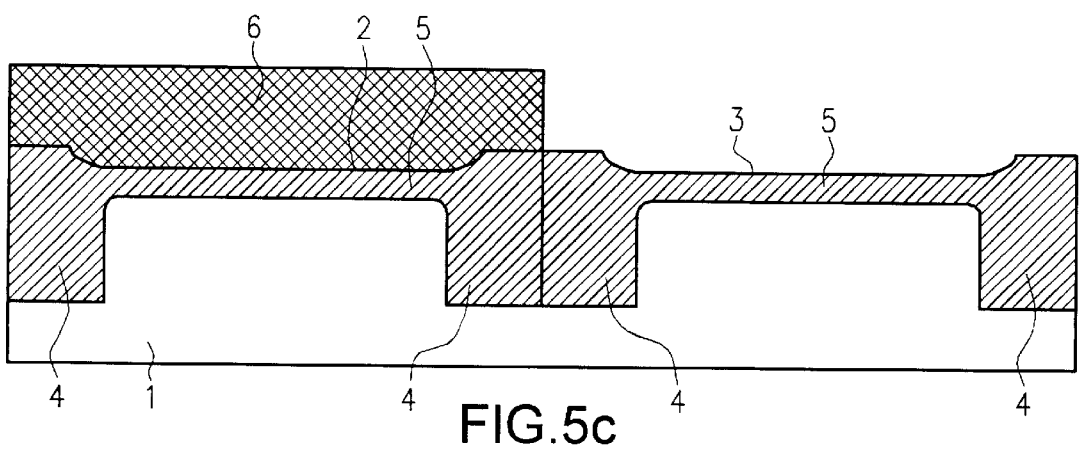
Figure 5D:
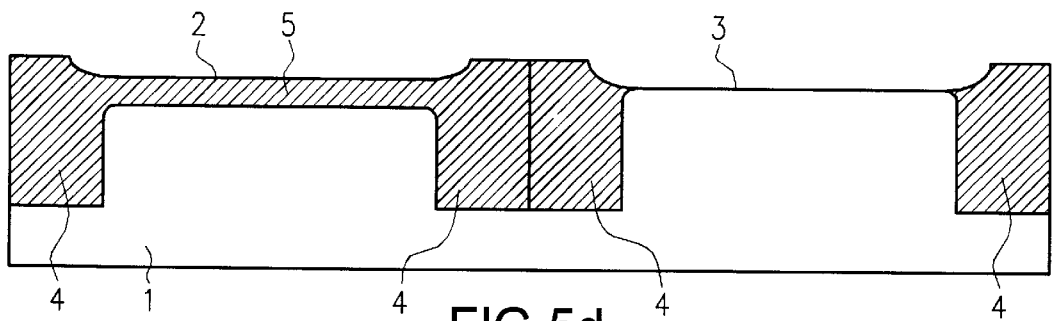
Figure 5E:
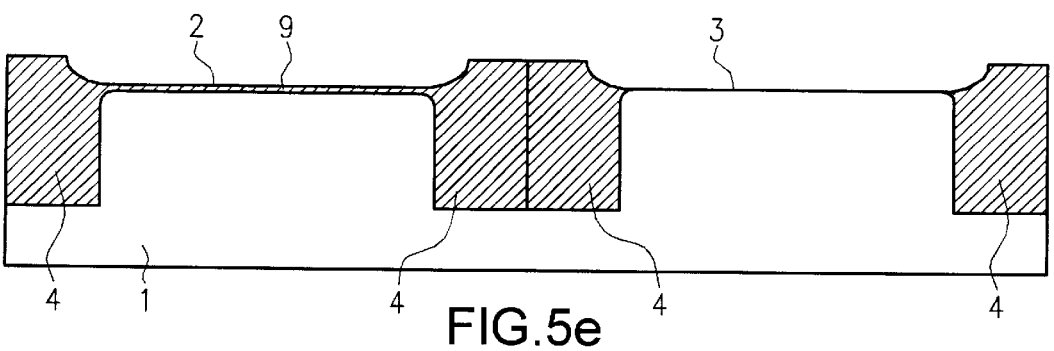
Figure 5F:
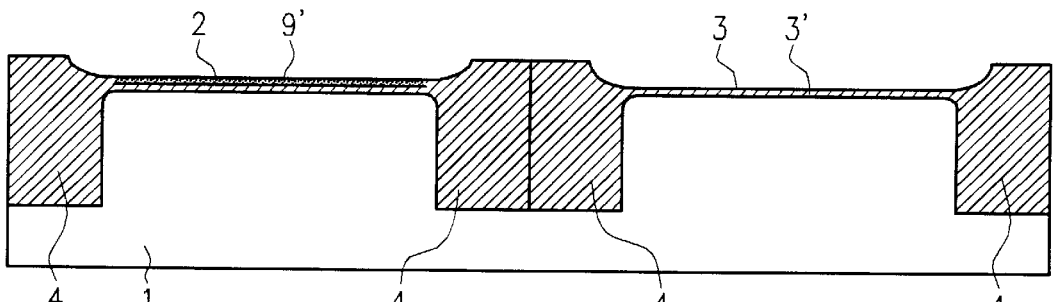

With reference to FIGS. 5a–5f, a process flow according to further illustrative embodiments will now be described. In a first step, as depicted in FIG. 5b, the initial layer 5 of nitrided oxide is formed on both portions 2 and 3 of the surface of the substrate. Subsequently, as depicted in FIG. 5c, the portion of the surface targeted for the thick layer of oxide (in the present case portion 2) is masked with a masking layer 6 that may be formed by depositing a masking resist material. In a next step, as depicted in FIG. 5d, the uncovered, initial layer 5 of nitrided oxide on portion 3 is removed by wet-etching or dry-etching. Since the initial layer 5 of nitrided oxide on portion 3 in this embodiment is simply removed, and there is no need of obtaining an intermediate layer of a predefined thickness, no particular measurements in this respect are required. Using this process flow, all that needs to be determined is that etching is performed for a period of time long enough to allow the substantially complete removal of the initial layer 5 on the portion 3. After the masking layer 6 is removed, the initial layer 5 on portion 2 is thinned so as to obtain the intermediate layer 9' of an intermediate thickness accommodating the desired final thickness difference between the final layer on portion 2 and the final layer on portion 3. Since, in some applications, a thickness difference of a few tenths of a nanometer (nm) is required, possibly within a strict tolerance, the intermediate thickness of the layer 9' must be defined accurately. For this purpose, in one embodiment, a wet-etching process may be used, wherein the substrate is immersed in an etching mixture having a predefined etching rate during a predefined period of time.

Once the initial layer 5 on portion 2 has been thinned to the predefmed intermediate thickness, a layer of oxide is formed on both portions 2 and 3. In various embodiments, conventional thermal growing procedures or chemical vapor disposition techniques or a combination thereof can be selected for forming the oxide layer. The intermediate nitrided oxide layer 9' an portion 2 will then be re-oxidized or added to the deposited oxide layer. Accordingly, the two oxide layers 9 are obtained. featuring a predefined thickness difference.

The embodiments described with reference to FIGS. 5a–5f have the advantage that a single masking step is sufficient. Moreover, since no high temperature oxidation processes are required for forming the layers of oxide, the process sequence does not substantially contribute to the thermal budget, and high reliability is achieved for both layers of oxide. Moreover, since the embodiments do not restrict the formation of the oxide layers to thermal oxidation, the process is thus compliant with emerging chemical vapor deposition techniques for gate dielectric deposition.

Figure 6:
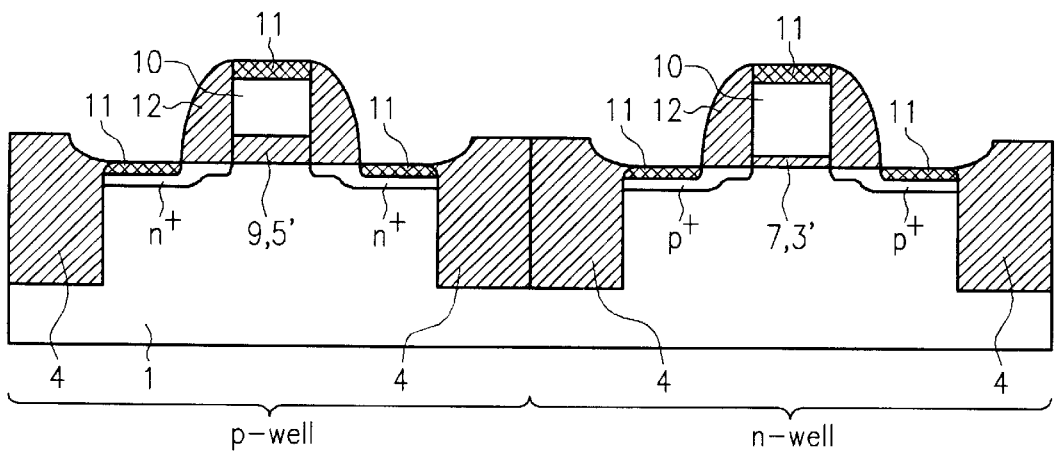
FIG. 6 schematically illustrates a final CMOS device wherein the gate oxide layers are realized according to one of the illustrative embodiments.

In FIG. 6 there is depicted an example of a CMOS transistor wherein the gate oxides have been formed with a method according to the illustrative embodiments. As anticipated above, this gate oxide will feature thicknesses that may differ by approximately 0.2 to 1.0 nm. Other portions of the CMOS transistor depicted in FIG. 6 may be completed by state of the art processing, wherein reference 10 relates to polysilicon layers, reference 11 relates to a self-aligned metal silicide and reference 12 relates to oxide spacers.

In conclusion, a method of forming layers of oxide of different thickness on the surface of a substrate is disclosed, which shows the following advantages with respect to prior art methods: (1) a limited number of masking steps is required; (2) very thin oxide layers, within the range of some tenths of a nanometer (nm) can be formed; (3) the thickness differences can be kept within the range of some tenths of a nanometer (nm); (4) no high temperature thermal oxidations are required; and (5) the process flow is compliant with the many sophisticated chemical vapor deposition techniques for gate dielectric deposition.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming at least one first layer of nitrided oxide of a first, predefined thickness on at least one first portion of the surface of a substrate and at least one second layer of nitrided oxide of a second, predefined, different thickness on at least one second portion of the surface of the substrate, comprising:

forming at least one initial layer of nitrided oxide of an initial thickness exceeding both the first and second predefined thickness on at least one first and one second portion of the surface of the substrate;

thinning the initial layer of nitrided oxide on the at least one first portion of the surface of the substrate to the respective, first predefined thickness; and thinning the initial layer of nitrided oxide on the at least one second portion of the surface of the substrate to the respective, second, predefined, different thickness.

2. A method as claimed in claim 1, wherein thinning the initial layer of nitrided oxide on the at least one first and one second portion of the surface of the substrate comprises:

masking the at least one first portion of the surface of the substrate and wet etching the uncovered, initial layer of nitrided oxide on the at least one second portion of the surface of the substrate; and masking the at least one second portion of the surface of the substrate and wet etching the uncovered, initial layer of nitrided oxide on the at least one first portion of the surface of the substrate.

3. A method as claimed in claim 2, wherein the initial layer of nitrided oxide is wet etched using an ammonium peroxide mixture having a predefined etching rate.

4. A method as claimed in claim 3, wherein the initial layer on the at least one first portion is wet etched during a first, predefined time and the initial layer on the at least one second portion is wet etched during a second, predefined, different time.

5. A method as claimed in claim 4, wherein the initial thickness of the initial layer of nitrided oxide exceeds the first and second predefined thickness by about 10–50%.

6. A method as claimed in claim 5, wherein the substrate comprises a semiconductor material.

7. A method as claimed in claim 6, wherein the substrate comprises a silicon wafer.

8. A method of forming at least one first layer of nitrided oxide of a first, predefined thickness on at least one first portion of the surface of a substrate and at least one second layer of nitrided oxide of a second, predefined, different thickness on at least one second portion of the surface of the substrate, comprising:

thermal growing at least one initial layer of oxide of an initial thickness exceeding both the first and second, predefined thickness on at least one first and one second portion of the surface of the substrate;

annealing the initial layer of oxide in a nitrogen-containing atmosphere so as to form an initial layer of nitrided oxide on the at least one first and one second portion of the surface of the substrate;

thinning the initial layer of nitrided oxide on the at least one first portion of the surface of the substrate to the respective, first predefined thickness; and thinning the initial layer of nitrided oxide on the at least one second portion of the surface of the substrate to the respective, second, predefined, different thickness.

9. A method as claimed in claim 8, wherein the nitrogen-containing atmosphere comprises one of ammonia ($NH_3$), nitrous oxide ($N_2O$) and nitric oxide (NO) and a mixture thereof.

10. A method as claimed in claim 9, wherein thinning the initial layer of nitrided oxide on the at least one first and one second portion of the surface of the substrate comprises:

masking the at least one first portion of the surface of the substrate and wet etching the uncovered, initial layer of the nitrided oxide on the at least one second portion of the surface of the substrate; and masking the at least one second portion of the surface of the substrate and wet etching the uncovered, initial layer of nitrided oxide on the at least one first portion of the surface of the substrate.

11. A method as claimed in claim 10, wherein the initial layer of nitrided oxide is wet etched using an ammonium peroxide mixture having a predefined etching rate.

12. A method as claimed in claim 11, wherein the initial layer on the at least one first portion is wet etched during a first, predefined time and the initial layer on the at least one second portion is wet etched during a second, predefined, different time.

13. A method as claimed in claim 12, wherein the initial thickness of the initial layer of nitrided oxide exceeds the first and second predefined thickness by about 10–50%.

14. A method as claimed in claim 13, wherein the substrate comprises a semiconductor material.

15. A method as claimed in claim 14, wherein the substrate comprises a silicon wafer.

16. A method of forming at least one first layer of nitrided oxide of a first, predefined thickness on at least one first portion of the surface of a substrate and at least one second layer of nitrided oxide of a second, predefined, different thickness on at least one second portion of the surface of the substrate, comprising:

thermal growing at least one layer of oxide in a nitrogen-containing atmosphere so as to form at least one initial layer of nitrided oxide of an initial thickness exceeding both the first and second predefined thickness on at least one first and one second portion of the surface of the substrate;

thinning the initial layer of nitrided oxide on the at least one first portion of the surface of the substrate to the respective, first predefined thickness; and thinning the initial layer of nitrided oxide on the at least one second portion of the surface of the substrate to the respective, second, predefined, different thickness.

17. A method as claimed in claim 16, wherein the nitrogen-containing atmosphere comprises one of nitrous oxide ($N_2O$) and nitric oxide (NO) and a mixture thereof.

18. A method as claimed in claim 17, wherein thinning the initial layer of nitrided oxide on the at least one first and one second portion of the surface of the substrate comprises:

masking the at least one first portion of the surface of the substrate and wet etching the uncovered, initial layer of nitrided oxide on the at least one second portion of the surface of the substrate; and masking the at least one second portion of the surface of the substrate and wet etching the uncovered, initial layer of nitrided oxide on the at least one first portion of the surface of the substrate.

19. A method as claimed in claim 18, wherein the initial layer of nitrided oxide is wet etched using an ammonium peroxide mixture having a predefined etching rate.

20. A method as claimed in claim 19, wherein the initial layer on the at least one first portion is wet etched during a first, predefined time and the initial layer on the at least one second portion is wet etched during a second, predefined, different time.

21. A method as claimed in claim 20, wherein the initial thickness of the initial layer of nitrided oxide exceeds the first and second predefined thickness by about 10–50%.

22. A method as claimed in claim 20, wherein the substrate comprises a semiconductor material.

23. A method as claimed in claim 22, wherein the substrate comprises a silicon wafer.

24. A method of forming at least one first layer of oxide of a first, predefined thickness on at least one first portion of the surface of a substrate and at least one second layer of oxide of a second, predefined, different thickness on at least one second portion of the surface of the substrate, comprising:
   forming at least one initial layer of nitrided oxide of an initial thickness exceeding both the first and second predefined thickness on at least one first and one second portion of the surface of the substrate;
   thinning the initial layer of nitrided oxide on the at least one first portion of the surface of the substrate to a first, intermediate thickness lower than the respective, first predefined thickness;
   thinning the initial layer of nitrided oxide on the at least one second portion of the surface of the substrate to a second, intermediate thickness different from the first intermediate thickness and lower than the respective, second predefined thickness; and
   adding a layer of oxide to the at least two layers of nitrided oxide so as to obtain at least two layers of oxide of predefined, different thickness.

25. A method as claimed in claim 24, wherein thinning the initial layer of nitrided oxide on the at least one first and one second portion of the surface of the substrate comprises:
   masking the at least one first portion of the surface of the substrate and wet etching the uncovered, initial layer of nitrided oxide on the at least one second portion of the surface of the substrate; and
   masking the at least one second portion of the surface of the substrate and wet etching the uncovered, initial layer of nitrided oxide on the at least one first portion of the surface of the substrate.

26. A method as claimed in claim 25, wherein the initial layer of nitrided oxide is wet etched using an ammonium peroxide mixture having a predefined etching rate.

27. A method as claimed in claim 26, wherein the initial layer on the at least one first portion is wet etched during a first, predefined time and the initial layer on the at least one second portion is wet etched during a second, predefined, different time.

28. A method as claimed in claim 27, wherein the initial thickness of the initial layer of nitrided oxide exceeds the first and second predefined thickness by about 10–50%.

29. A method as claimed in claim 28, wherein the substrate comprises a semiconductor material.

30. A method as claimed in claim 29, wherein the substrate comprises a silicon wafer.

31. A method of forming at least one first layer of oxide of a first, predefined thickness on at least one first portion of the surface of a substrate and at least one second layer of oxide of a second, predefined, different thickness on at least one second portion of the surface of the substrate, comprising:
   thermal growing at least one initial layer of oxide of an initial thickness exceeding both the first and second, predefined thickness on at least one first and one second portion of the surface of the substrate;
   annealing the initial layer of oxide in a nitrogen-containing atmosphere so as to form an initial layer of nitrided oxide on the at least one first and one second portion of the surface of the substrate;
   thinning the initial layer of nitrided oxide on the at least one first portion of the surface of the substrate to a first, intermediate thickness lower than the respective, first predefined thickness;
   thinning the initial layer of nitrided oxide on the at least one second portion of the surface of the substrate to a second, intermediate thickness different from the first intermediate thickness and lower than the respective, second predefined thickness; and
   thermal growing a layer of oxide on the at least two layers of nitrided oxide so as to obtain at least two layers of oxide of predefined, different thickness.

32. A method as claimed in claim 31, wherein the nitrogen-containing atmosphere comprises one of ammonia ($NH_3$), nitrous oxide $N_2O$) and nitric oxide (NO) and a mixture thereof.

33. A method as claimed in claim 32, wherein thinning the initial layer of nitrided oxide on the at least one first and one second portion of the surface of the substrate comprises:
   masking the at least one first portion of the surface of the substrate and wet etching the uncovered, initial layer of nitrided oxide on the at least one second portion of the surface of the substrate; and
   masking the at least one second portion of the surface of the substrate and wet etching the uncovered, initial layer of nitrided oxide on the at least one first portion of the surface of the substrate.

34. A method as claimed in claim 33, wherein the initial layer of nitrided oxide is wet etched using an ammonium peroxide mixture having a predefined etching rate.

35. A method as claimed in claim 34, wherein the initial layer on the at least one first portion is wet etched during a first, predefined time and the initial layer on the at least one second portion is wet etched during a second, predefined, different time.

36. A method as claimed in claim 35, wherein the initial thickness of the initial layer of nitrided oxide exceeds the first and second predefined thickness by about 10–50%.

37. A method as claimed in claim 36, wherein the substrate comprises a semiconductor material.

38. A method as claimed in claim 37, wherein the substrate comprises a silicon wafer.

39. A method of forming at least one first layer of oxide of a first, predefined thickness on at least one first portion of the surface of a substrate and at least one second layer of oxide of a second, predefined, different thickness on at least one second portion of the surface of the substrate, comprising:
   thermal growing at least one layer of oxide in a nitrogen-containing atmosphere so as to form at least one initial layer of nitrided oxide of an initial thickness exceeding both the first and second predefined thickness on at least one first and one second portion of the surface of the substrate;

thinning the initial layer of nitrided oxide on the at least one first portion of the surface of the substrate to a first, intermediate thickness lower than the respective, first predefined thickness;

thinning the initial layer of nitrided oxide on the at least one second portion of the surface of the substrate to a second, intermediate thickness different from the first intermediate thickness and lower than the respective, second predefined thickness;

thermal growing a layer of oxide on the at least two layers of nitrided oxide so as to obtain at least two layers of oxide of predefined, different thickness.

40. A method as claimed in claim 39, wherein the nitrogen-containing atmosphere comprises one of nitrous oxide ($N_2O$) and nitric oxide (NO) and a mixture thereof.

41. A method as claimed in claim 40, wherein thinning the initial layer of nitrided oxide on the at least one first and one second portion of the surface of the substrate comprises:

masking the at least one first portion of the surface of the substrate and wet etching the uncovered, initial layer of nitrided oxide on the at least one second portion of the surface of the substrate; and masking the at least one second portion of the surface of the substrate and wet etching the uncovered, initial layer of nitrided oxide on the at least one first portion of the surface of the substrate.

42. A method as claimed in claim 41, wherein the initial layer of nitrided oxide is wet etched using an ammonium peroxide mixture having a predefined etching rate.

43. A method as claimed in claim 42, wherein the initial layer on the at least one first portion is wet etched during a first, predefined time and the initial layer on the at least one second portion is wet etched during a second, predefined, different time.

44. A method as claimed in claim 43, wherein the initial thickness of the initial layer of nitrided oxide exceeds the first and second predefined thickness by about 10–50%.

45. A method as claimed in claim 44, wherein the substrate comprises a semiconductor material.

46. A method as claimed in claim 45, wherein the substrate comprises a silicon wafer.

47. A method of forming at least one first layer of oxide of a first, predefined thickness on at least one first portion of the surface of a substrate and at least one second layer of oxide of a second, predefined, different thickness on at least one second portion of the surface of the substrate, comprising:

thermal growing at least one initial layer of oxide of an initial thickness exceeding both the first and second, predefined thickness on at least one first and one second portion of the surface of the substrate;

annealing the initial layer of oxide in a nitrogen-containing atmosphere so as to form an initial layer of nitrided oxide on the at least one first and one second portion of the surface of the substrate;

thinning the initial layer of nitrided oxide on the at least one first portion of the surface of the substrate to a first, intermediate thickness lower than the respective, first predefined thickness;

thinning the initial layer of nitrided oxide on the at least one second portion of the surface of the substrate to a second, intermediate thickness different from the first intermediate thickness and lower than the respective, second predefined thickness;

depositing a layer of oxide on the at least two layers of nitrided oxide with a chemical vapor deposition process so as to obtain at least two layers of oxide of predefined, different thickness.

48. A method as claimed in claim 47, wherein the nitrogen-containing atmosphere comprises one of ammonia ($NH_3$), nitrous oxide ($N_2O$) and nitric oxide (NO) and a mixture thereof.

49. A method as claimed in claim 48, wherein thinning the initial layer of nitrided oxide on the at least one first and one second portion of the surface of the substrate comprises:

masking the at least one first portion of the surface of the substrate and wet etching the uncovered, initial layer of nitrided oxide on the at least one second portion of the surface of the substrate; and masking the at least one second portion of the surface of the substrate and wet etching the uncovered, initial layer of nitrided oxide on the at least one first portion of the surface of the substrate.

50. A method as claimed in claim 49, wherein the initial layer of nitrided oxide is wet etched using an ammonium peroxide mixture having a predefined etching rate.

51. A method as claimed in claim 50, wherein the initial layer on the at least one first portion is wet etched during a first, predefined time and the initial layer on the at least one second portion is wet etched during a second, predefined, different time.

52. A method as claimed in claim 51, wherein the initial thickness of the initial layer of nitrided oxide exceeds the first and second predefined thickness by about 10–50%.

53. A method as claimed in claim 52, wherein the substrate comprises a semiconductor material.

54. A method as claimed in claim 53, wherein the substrate comprises a silicon wafer.

55. A method of forming at least one first layer of oxide of a first, predefined thickness on at least one first portion of the surface of a substrate and at least one second layer of oxide of a second, predefined, different thickness on at least one second portion of the surface of the substrate, comprising:

thermal growing at least one layer of oxide in a nitrogen-containing atmosphere so as to form at least one initial layer of nitrided oxide of an initial thickness exceeding both the first and second predefined thickness on at least one first and one second portion of the surface of the substrate;

thinning the initial layer of nitrided oxide on the at least one first portion of the surface of the substrate to a first, intermediate thickness lower than the respective, first predefined thickness;

thinning the initial layer of nitrided oxide on the at least one second portion of the surface of the substrate to a second, intermediate thickness different from the first intermediate thickness and lower than the respective, second predefined thickness;

depositing a layer of oxide on the at least two layers of nitrided oxide with a chemical vapor deposition process so as to obtain at least two layers of oxide of predefined, different thickness.

56. A method as claimed in claim 55, wherein the nitrogen-containing atmosphere comprises one of nitrous oxide ($N_2O$) and nitric oxide (NO) and a mixture thereof.

57. A method as claimed in claim 56, wherein thinning the initial layer of nitrided oxide on the at least one first and one second portion of the surface of the substrate comprises:

masking the at least one first portion of the surface of the substrate and wet etching the uncovered, initial layer of nitrided oxide on the at least one second portion of the surface of the substrate; and masking the at least one second portion of the surface of the substrate and wet etching the uncovered, initial layer of nitrided oxide on the at least one first portion of the surface of the substrate.

58. A method as claimed in claim 57, wherein the initial layer of nitrided oxide is wet etched using an ammonium peroxide mixture having a predefined etching rate.

59. A method as claimed in claim 58, wherein the initial layer on the at least one first portion is wet etched during a first, predefined time and the initial layer on the at least one second portion is wet etched during a second, predefined, different time.

60. A method as claimed in claim 59, wherein the initial thickness of the initial layer of nitrided oxide exceeds the first and second predefined thickness by about 10–50%.

61. A method as claimed in claim 60, wherein the substrate comprises a semiconductor material.

62. A method as claimed in claim 61, wherein the substrate comprises a silicon wafer.

63. A method of forming at least one first layer of oxide of a first, predefined thickness on at least one first portion of the surface of a substrate and at least one second layer of oxide of a second, predefined, different thickness on at least one second portion of the surface of the substrate, comprising:

thermal growing at least one initial layer of oxide of an initial thickness exceeding both the first and second, predefined thickness on at least one first and one second portion of the surface of the substrate;

annealing the initial layer of oxide in a nitrogen-containing atmosphere so as to form an initial layer of nitrided oxide on the at least one first and one second portion of the surface of the substrate;

removing the layer of nitrided oxide from the at least one first portion of the surface of the substrate targeted for the thin layer of oxide;

thinning the initial layer of nitrided oxide on the at least one second portion of the surface of the substrate targeted for the thick layer of oxide to a thickness lower than the respective, predefined thickness;

thermal growing a layer of oxide on the at least one first and one second portion of the surface of the substrate so as to obtain at least two layers of oxide of predefined, different thickness.

64. A method as claimed in claim 63, wherein removing the layer of nitrided oxide from the at least one first portion of the surface of the substrate targeted for the thin layer of oxide comprises masking the at least one second portion of the surface of the substrate targeted for the thick layer of oxide and dry-etching or wet-etching the layer of nitrided oxide on the at least one first portion of the surface of the substrate targeted for the thin layer of oxide.

65. A method as claimed in claim 64, wherein thinning the initial layer of nitrided oxide on the at least one second portion of the surface of the substrate targeted for the thick layer of oxide comprises masking the at least one first portion of the surface of the substrate targeted for the thin layer of oxide and wet etching the uncovered, initial layer of nitrided oxide on the at least one second portion of the surface of the substrate targeted for the thick layer of oxide.

66. A method as claimed in claim 65, wherein the initial layer of nitrided oxide on the at least one second portion of the surface of the substrate targeted for the thick layer of oxide is wet etched during a predefined period of time with an ammonium peroxide mixture having a predefined etching rate.

67. A method as claimed in claim 66, wherein the initial layer of nitrided oxide on the at least one second portion of the surface of the substrate targeted for the thick layer of oxide is thinned to a thickness accommodating the final thickness difference between the thick and the thin layer of oxide.

68. A method as claimed in 67, wherein the initial thickness of the initial layer of nitrided oxide exceeds the first and second predefined thickness by about 10–50%.

69. A method as claimed in claim 68, wherein the substrate comprises a semiconductor material.

70. A method as claimed in claim 69, wherein the substrate comprises a silicon wafer and the at least one first and second portion of the surface of the substrate correspond to the gate regions of a CMOS transistor to be realized on the wafer.

71. A method as claimed in claim 70, wherein the nitrogen-containing atmosphere comprises one of ammonia ($NH_3$), nitrous oxide ($N_2O$) and nitric oxide (NO) and a mixture thereof.

72. A method of forming at least one first layer of oxide of a first, predefined thickness on at least one first portion of the surface of a substrate and at least one second layer of oxide of a second, predefined, different thickness on at least one second portion of the surface of the substrate, comprising:

thermal growing at least one layer of oxide in a nitrogen-containing atmosphere so as to form at least one initial layer of nitrided oxide of an initial thickness exceeding both the first and second predefined thickness on at least one first and one second portion of the surface of the substrate;

removing the layer of nitrided oxide from the at least one first portion of the surface of the substrate targeted for the thin layer of oxide;

thinning the initial layer of nitrided oxide on the at least one second portion of the surface of the substrate targeted for the thick layer of oxide to a thickness lower than the respective, predefined thickness; and thermal growing a layer of oxide on the at least one first and one second portion of the surface of the substrate so as to obtain at least two layers of oxide of predefined, different thickness.

73. A method as claimed in claim 72, wherein removing the layer of nitrided oxide from the at least one first portion of the surface of the substrate targeted for the thin layer of oxide comprises masking the at least one second portion of the surface of the substrate targeted for the thick layer of oxide and dry-etching or wet-etching the layer of oxide on the at least one first portion of the surface of the substrate targeted for the thin layer of oxide.

74. A method as claimed in claim 73, wherein thinning the initial layer of nitrided oxide on the at least one second portion of the surface of the substrate targeted for the thick layer of oxide comprises masking the at least one first portion of the surface of the substrate targeted for the thin layer of oxide and wet etching the uncovered, initial layer of nitrided oxide on the at least one second portion of the surface of the substrate targeted for the thick layer of oxide.

75. A method as claimed in claim 74, wherein the initial layer of nitrided oxide on the at least one second portion of the surface of the substrate targeted for the thick layer of oxide is wet etched during a predefined period of time with an ammonium peroxide mixture having a predefined etching rate.

76. A method as claimed in claim 75, wherein the initial layer of nitrided oxide on the at least one second portion of the surface of the substrate targeted for the thick layer of oxide is thinned to a thickness accommodating the final thickness difference between the thick and the thin oxide.

77. A method as claimed in claim 76, wherein the initial thickness of the initial layer of nitrided oxide exceeds the first and second predefined thickness by about 10–50%.

78. A method as claimed in claim 77, wherein the substrate comprises a semiconductor material.

79. A method as claimed in claim 78, wherein the substrate comprises a silicon wafer and the at least one first and second portion on the surface of the substrate correspond to the gate regions of a CMOS transistor to be realized on the wafer.

80. A method as claimed in claim 79, wherein the nitrogen-containing atmosphere comprises one of nitrous oxide ($N_2O$) and nitric oxide (NO) and a mixture thereof.

81. A method of forming at least one first layer of oxide of a first, predefined thickness on at least one first portion of the surface of a substrate and at least one second layer of oxide of a second, predefined, different thickness on at least one second portion of the surface of the substrate, comprising:
thermal growing at least one initial layer of oxide of an initial thickness exceeding both the first and second, predefined thickness on at least one first and one second portion of the surface of the substrate;
annealing the initial layer of oxide in a nitrogen-containing atmosphere so as to form an initial layer of nitrided oxide on the at least one first and one second portion of the surface of the substrate;
removing the layer of nitrided oxide from the at least one first portion of the surface of the substrate targeted for the thin layer of oxide;
thinning the initial layer of nitrided oxide on the at least one second portion of the surface of the substrate targeted for the thick layer of oxide to a thickness lower than the respective, predefined thickness; and
depositing a layer of oxide on the at least one first and second portion of the surface of the substrate so as to obtain at least two layers of oxide of predefined, different thickness.

82. A method as claimed in claim 81, wherein removing the layer of nitrided oxide from the at least one first portion of the surface of the substrate targeted for the thin layer of oxide comprises masking the at least one second portion of the surface of the substrate targeted for the thick layer of oxide and dry-etching or wet-etching the layer of oxide on the at least one first portion of the surface of the substrate targeted for the thin layer of oxide.

83. A method as claimed in claim 82, wherein thinning the initial layer of nitrided oxide on the at least one second portion of the surface of the substrate targeted for the thick layer of oxide comprises masking the at least one first portion of the surface of the substrate targeted for the thin layer of oxide and wet etching the uncovered, initial layer of nitrided oxide on the at least one second portion of the surface of the substrate targeted for the thick layer of oxide.

84. A method as claimed in claim 83, wherein the initial layer of nitrided oxide on the at least one second portion of the surface of the substrate targeted for the thick layer of oxide is wet etched during a predefined period of time with an ammonium peroxide mixture having a predefined etching rate.

85. A method as claimed in claim 84, wherein the initial layer of nitrided oxide on the at least one second portion of the surface of the substrate targeted for the thick layer of oxide is thinned to a thickness accommodating the final thickness difference between the thick and the thin layer of oxide.

86. A method as claimed in claim 85, wherein the substrate comprises a semiconductor material.

87. A method as claimed in claim 86, wherein the substrate comprises a silicon wafer and the at least one first and second portion on the surface of the substrate correspond to the gate regions of a CMOS transistor to be realized on the wafer.

88. A method as claimed in claim 87, wherein the nitrogen-containing atmosphere comprises one of ammonia ($NH_3$), nitrous oxide ($N_2O$) and nitric oxide (NO) and a mixture thereof.

89. A method of forming at least one first layer of oxide of a first, predefined thickness on at least one first portion of the surface of a substrate and at least one second layer of oxide of a second, predefined, different thickness on at least one second portion of the surface of the substrate, comprising:
thermal growing at least one layer of oxide in a nitrogen-containing atmosphere so as to form at least one initial layer of nitrided oxide of an initial thickness exceeding both the first and second predefined thickness on at least one first and one second portion of the surface of the substrate;
removing the layer of nitrided oxide from the at least one first portion of the surface of the substrate targeted for the thin layer of oxide;
thinning the initial layer of nitrided oxide on the at least one second portion of the surface of the substrate targeted for the thick layer of oxide to a thickness lower than the respective, predefined thickness; and
depositing a layer of oxide on the at least one first and second portion of the surface of the substrate so as to obtain at least two layers of oxide of predefined, different thickness.

90. A method as claimed in claim 89, wherein removing the layer of nitrided oxide from the at least one first portion of the surface of the substrate targeted for the thin layer of oxide comprises masking the at least one second portion of the surface of the substrate targeted for the thick layer of oxide and dry-etching or wet-etching the layer of oxide on the at least one first portion of the surface of the substrate targeted for the thin layer of oxide.

91. A method as claimed in claim 90, wherein thinning the initial layer of nitrided oxide on the at least one second portion of the surface of the substrate targeted for the thick layer of oxide comprises masking the at least one first portion of the surface of the substrate targeted for the thin layer of oxide and wet etching the uncovered, initial layer of nitrided oxide on the at least one second portion of the surface of the substrate targeted for the thick layer of oxide.

92. A method as claimed in claim 91, wherein the initial layer of nitrided oxide on the at least one second portion of the surface of the substrate targeted for the thick layer of oxide is wet etched during a predefined period of time with an ammonium peroxide mixture having a predefined etching rate.

93. A method as claimed in claim 92, wherein the initial layer of nitrided oxide on the at least one second portion of the surface of the substrate targeted for the thick layer of oxide is thinned to a thickness accommodating the final thickness difference between the thick and the thin layer of oxide.

94. A method as claimed in claim 93, wherein the substrate comprises a semiconductor material.

95. A method as claimed in claim 94, wherein the substrate comprises a silicon wafer and the at least one first and second portion of the surface of the substrate correspond to the gate regions of a CMOS transistor to be realized on the wafer.

96. A method as claimed in claim 95, wherein the nitrogen-containing atmosphere comprises one of nitrous oxide ($N_2O$) and nitric oxide (NO) and a mixture thereof.

* * * * *